(12) United States Patent
Zhang et al.

(10) Patent No.: US 12,055,573 B2
(45) Date of Patent: Aug. 6, 2024

(54) ELECTROMAGNETIC WAVE SPATIAL ANALYSIS METHOD BASED ON MULTI-LEVEL MAGNETIC DIPOLE GROUP MODELING

(71) Applicant: HUAZHONG UNIVERSITY OF SCIENCE AND TECHNOLOGY, Hubei (CN)

(72) Inventors: Tianxu Zhang, Hubei (CN); Tao Zhang, Hubei (CN); Qinghui Zhang, Hubei (CN); Cheng Yang, Hubei (CN); Jiawei Wang, Hubei (CN); Jiandong Tan, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 39 days.

(21) Appl. No.: 18/148,454

(22) Filed: Dec. 30, 2022

(65) Prior Publication Data
US 2023/0213565 A1    Jul. 6, 2023

(30) Foreign Application Priority Data
Dec. 31, 2021  (CN) .......................... 202111679742.8

(51) Int. Cl.
*G01R 29/08*    (2006.01)

(52) U.S. Cl.
CPC ..... *G01R 29/0871* (2013.01); *G01R 29/0878* (2013.01); *G01R 29/0892* (2013.01)

(58) Field of Classification Search
None
See application file for complete search history.

(56) References Cited

U.S. PATENT DOCUMENTS

| 10,637,535 | B1* | 4/2020 | Vannucci | ............... H04B 3/542 |
| 2010/0125438 | A1* | 5/2010 | Audet | ............... G01R 29/0857 702/189 |

(Continued)

*Primary Examiner* — Wilson Lee
(74) *Attorney, Agent, or Firm* — HSML P.C.

(57) ABSTRACT

The present invention discloses an electromagnetic wave spatial analysis method based on multi-level dipole group modeling. The electromagnetic wave spatial analysis method includes the following steps: S1, obtaining a magnetic dipole group according to three-phase loops of power grids of various different voltage levels, and obtaining spatial coordinates of the magnetic dipole group according to the longitudes and latitudes as well as the altitudes of the power grids of various voltage levels; S2, calculating the loop length of each three-phase magnetic dipole according to the spatial coordinates of the magnetic dipole group, and obtaining a multi-level magnetic dipole group according to the loop lengths; S3, obtaining the current corresponding to the voltage on power transmission loops in the power grids of various voltage levels at different levels according to the installed capacities of the power grids of various voltage levels in different countries; S4, building a multi-level dipole model according to the multi-level magnetic dipole group and the current; and S5, solving the multi-level dipole model to obtain spatial power frequency electromagnetic wave distribution. The altitude factor of grid distribution is added in the present invention, and the power grids are divided into multiple levels for modeling analysis respectively, thereby increasing the analytical accuracy of power frequency electromagnetic waves.

7 Claims, 7 Drawing Sheets

(56) References Cited

U.S. PATENT DOCUMENTS

2015/0109000 A1* 4/2015 Sieber .................. B60L 53/124
                                                              324/655
2018/0241258 A1* 8/2018 Seong ..................... G01B 7/14
2021/0270884 A1* 9/2021 Wetherbee ......... G01R 29/0878

* cited by examiner

ELECTROMAGNETIC WAVE SPATIAL ANALYSIS METHOD BASED ON MULTI-LEVEL MAGNETIC DIPOLE GROUP MODELING

TECHNICAL FIELD

The present invention pertains to the cross field of non-acoustic underwater detection and multi-dimensional signal processing technology and more specifically, relates to an electromagnetic wave spatial analysis method based on multi-level magnetic dipole group modeling.

BACKGROUND ART

In the context of the new situation of economic globalization, global trade is extremely close. The total import and export volume of all countries in the world, especially China, shows a rapid growth rate. Ship transportation is favored by global enterprises and businesses with its huge freight volume and efficient cargo security. As a result, the number of ships and the tonnage of ships in ship manufacturing enterprises increase year by year. Safety issues with the ships during navigation have always been the focus of attention.

Ferromagnetic objects such as shipwrecks and naval mines left by wars are widely studied in marine exploration. The shipwreck salvage and naval mine detection need accurate locating. At the same time, underwater shipwrecks and naval mines are also important elements that affect the marine navigation environment. At the same time, the increasing range of activities of autonomous underwater vehicles and underwater robots has also become an important factor affecting the marine navigation. It is particularly important to detect ferromagnetic targets such as the shipwrecks and the autonomous underwater vehicles during ship navigation.

The conventional underwater target detection means is typically the use of a sonar detection method, which senses the orientation of the target by receiving the sonar echo of the detected object. There are some problems in using sonar to detect underwater targets such as the shipwrecks. The shipwrecks are often covered by ocean sediment, while the sonar means is susceptible to the disturbance of the undulating terrain of the seabed, resulting in many false alarm detections. At the same time, acoustic detection needs to arrange a large number of detection arrays, which is expensive and vulnerable to the interference of marine background noise. Using the acoustic detection means, it has been difficult to detect underwater targets hidden under the ocean background noise across a long distance and within a large range, which cannot meet the detection needs of the vast sea areas in China. Therefore, it is urgent to develop new non-acoustic remote sensing detection means to detect underwater targets.

In the prior art, equivalent ultra-long wave antenna array modeling analysis is carried out on the power grids of various voltage levels, but model building is only carried out on a plane. The plane modeling method can only ensure the correctness of modeling and simulation data in the near-field regions with the power grids of various voltage levels, since it ignores the refraction that may occur when the electromagnetic waves propagate to the far-field regions, and also ignores that the curvature of the ionized layer itself will also have a certain impact on the reflection of the electromagnetic waves. Therefore, the accuracy of quantitative analysis of power frequency electromagnetic waves is low.

SUMMARY OF THE INVENTION

To address the defects of the prior art, the present invention provides an electromagnetic wave spatial analysis method based on multi-level magnetic dipole group modeling, aiming to solve the problem of low analysis accuracy of power frequency electromagnetic waves in the prior art due to the fact that modeling can only be carried out on a plane.

The present invention provides an electromagnetic wave spatial analysis method based on multi-level dipole group modeling, comprising the following steps:

S1, obtaining a magnetic dipole group according to three-phase loops of power grids of various different voltage levels, and obtaining spatial coordinates of the magnetic dipole group according to the longitudes and latitudes as well as the altitudes of the power grids of various voltage levels;

S2, calculating the loop length of each three-phase magnetic dipole according to the spatial coordinates of the magnetic dipole group, and obtaining a multi-level magnetic dipole group including magnetic dipoles and antenna arrays implementing magnetic dipole functions according to the loop lengths;

S3, obtaining the current corresponding to the voltage on power transmission loops in the power grids of various voltage levels at different levels according to the installed capacities of the power grids of various voltage levels in different countries;

S4, building a multi-level dipole model according to the multi-level magnetic dipole group and the current; and S5, solving the multi-level dipole model to obtain spatial power frequency electromagnetic wave distribution.

Further, in step S1, by directly performing statistics to obtain the longitudes and latitudes of grid nodes, a curved surface model is constructed according to the curvature of the earth, and the spatial coordinates of the magnetic dipoles are calculated according to the longitudes and latitudes.

Further, in step S2, the loop length of each three-phase magnetic dipole is obtained by taking into account the altitude factor of the power transmission loops.

Further, in step S2, the multi-level magnetic dipole group is established by making the power grid of each voltage level corresponding to any one of the loop lengths $\lambda$, $\lambda/2$, $\lambda/4$, $\lambda/8$, and $\lambda/10$ equivalent to a magnetic dipole, and making the multiple power transmission loops with the sum of lengths satisfying the length conditions described above equivalent to the antenna arrays implementing the magnetic dipole functions.

Further, in step S4, the multi-level dipole model comprises: an ionized layer, a land-ocean-seabed layer, and an air layer.

A multi-level medium model is built taking into account the absorption and refraction of power frequency electromagnetic waves by the ionized layer and the factor that the power frequency electromagnetic waves reach a seawater layer through the land and the seabed; and a simulated multi-level dipole group model is built by carrying out modeling on a high-voltage power transmission network by the voltage levels respectively.

Further, step S5 specifically comprises: calculating the electromagnetic wave transmission characteristic and the spatial distribution of each power transmission loop of which the voltage level is equivalent to a dipole or the power transmission loops capable of implementing the dipole functions, and carrying out vector superposition on power frequency electromagnetic waves generated by the power transmission loops with multiple voltage levels in a space.

Through the above technical solution contemplated by the present invention, compared to the prior art, the altitude factor of grid distribution is added, and the power grids are divided into multiple levels for modeling analysis respectively, so that the beneficial effect of increasing the analytical accuracy of power frequency electromagnetic waves can be achieved.

DETAILED DESCRIPTION

To make the purpose, technical solution, and advantages of the present invention clearer, the present invention is further described in detail below in connection with the accompanying drawings and embodiments. It should be appreciated that the specific embodiments described here are used merely to explain the present invention and are not used to define the present invention.

The present invention introduces an electromagnetic wave spatial analysis method based on multi-level magnetic dipole group modeling, which adds the altitude factor of power grid distribution, takes into account the terrain fluctuation during construction of a power grid model, and can simulate the power grid characteristics in curved surface distribution on the surface of the earth. In addition, the power grid is divided into multiple levels for modeling and analysis respectively, the unified power frequency electromagnetic wave propagation of a power frequency ultra-long wave magnetic dipole group and the influence framework thereof are researched, and the propagation characteristics of the power frequency electromagnetic waves in various media of existing power grids of various voltage levels are researched. In particular, the problem of insufficient research on the propagation mode, spatial distribution, and influence of the power frequency electromagnetic waves is solved. The free resource of power frequency electromagnetic waves is brought into engineering practice, thereby improving the analysis accuracy of the power frequency electromagnetic waves.

Due to different factors such as power supply mode, power supply load, and power supply distance, all countries divide the power grid into multiple voltage levels for power transmission in the construction of power grid. This is to avoid power resource waste caused by a too high voltage level and an insufficient load. Under the circumstance that the voltage level is too low, the infrastructure needs to be frequently upgraded. Taking the United States as an example, the power transmission system throughout the United States is generally divided into three voltage levels: 345 kV to 499 kV, 500 kV to 699 kV, and 700 kV to 799 kV. In addition, 1000 kV direct current is available. However, the main research object of the present invention is the power frequency electromagnetic waves, not taking into account direct current. These different high-voltage power frequency alternating power transmission networks are modeled and analyzed separately.

Figure 1:
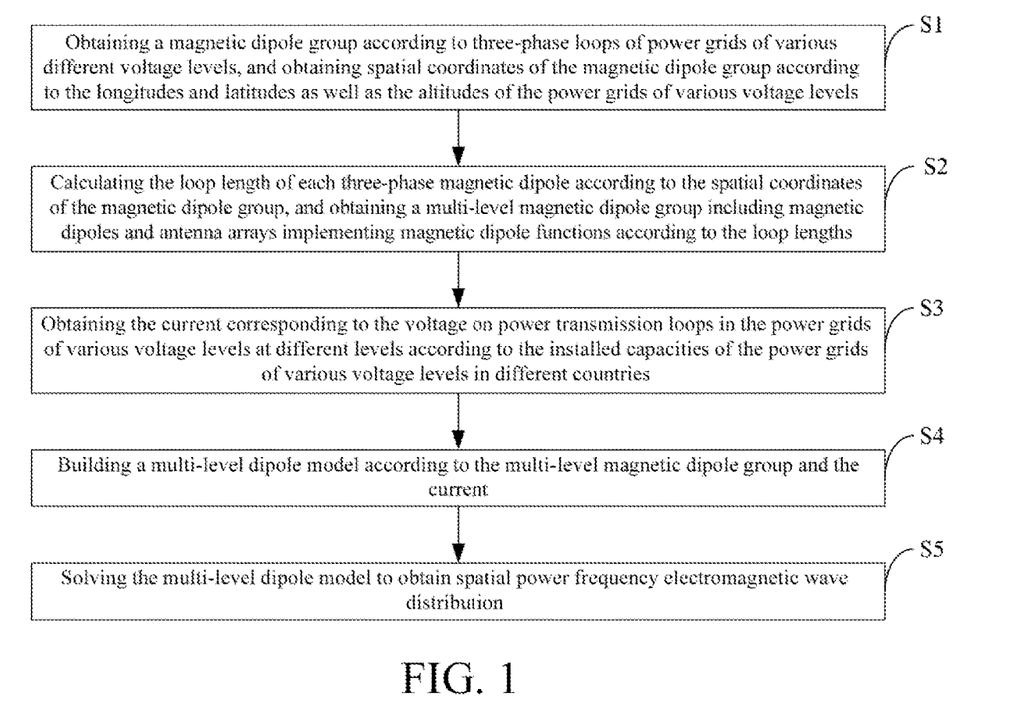
FIG. 1 is an implementation flow chart of an electromagnetic wave spatial analysis method based on multi-level dipole group modeling provided by the embodiment of the present invention.
Figure 2:
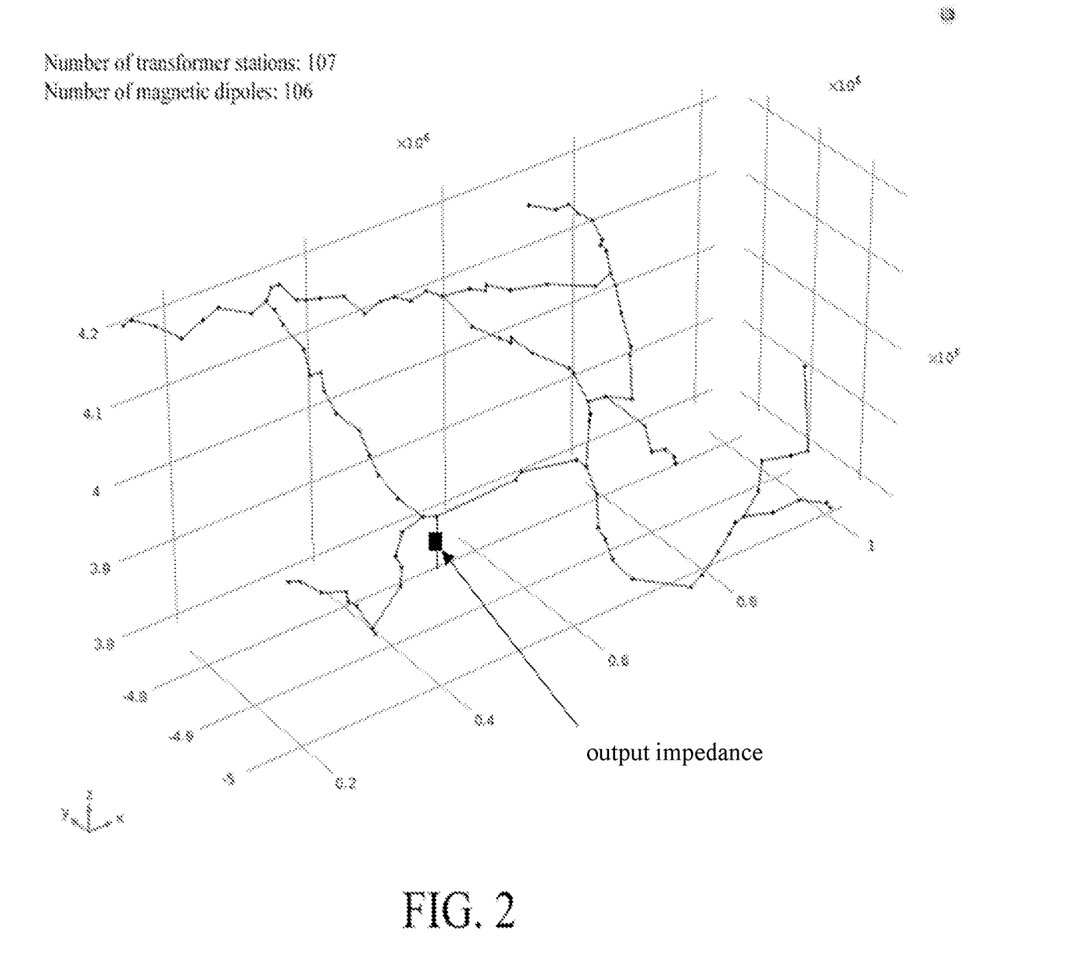
FIG. 2 is a distribution diagram of power grids with the voltage levels of 700 kV to 799 kV.
Figure 3:
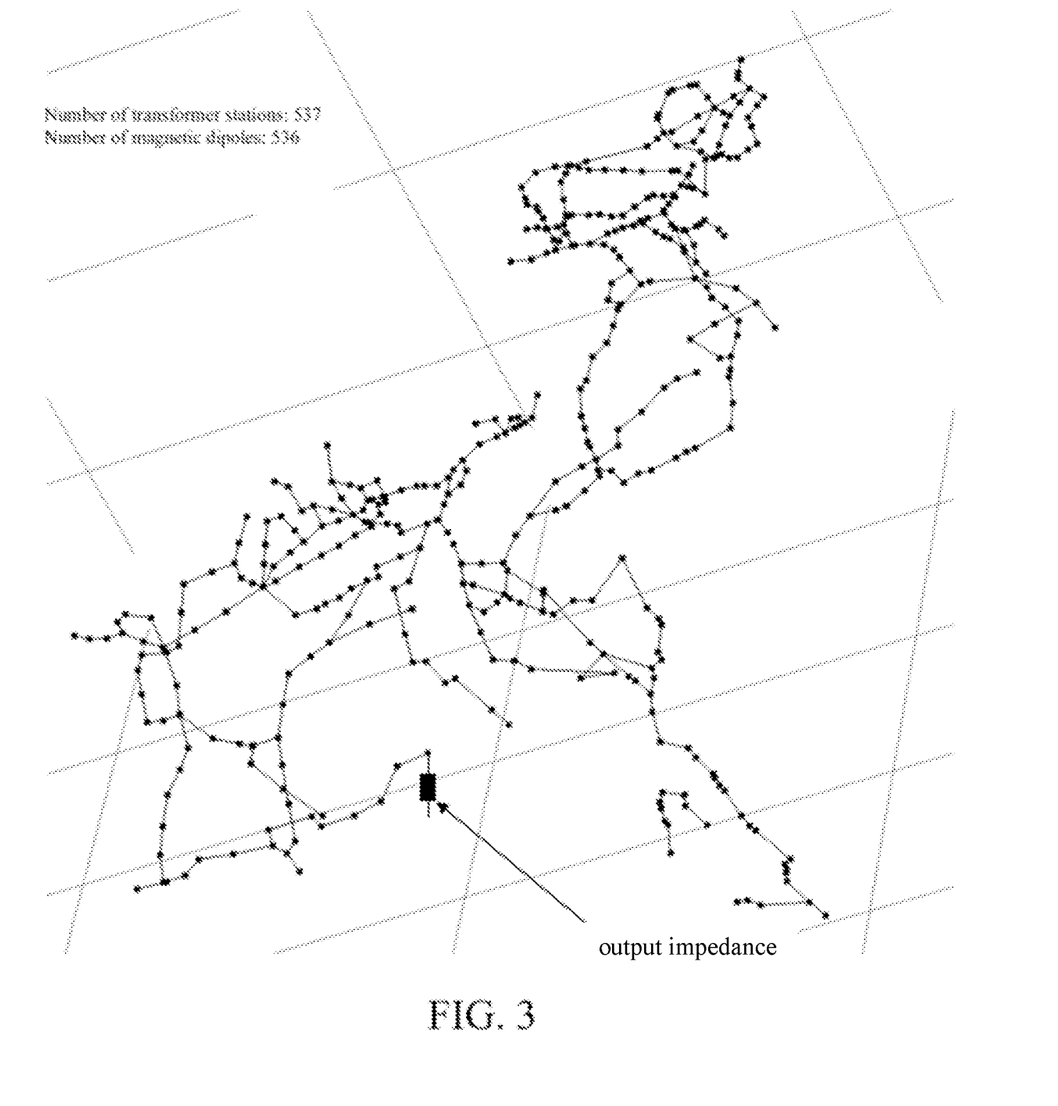
FIG. 3 is a distribution diagram of power grids with the voltage levels of 500 kV to 699 kV (Eastern United States)
Figure 4:
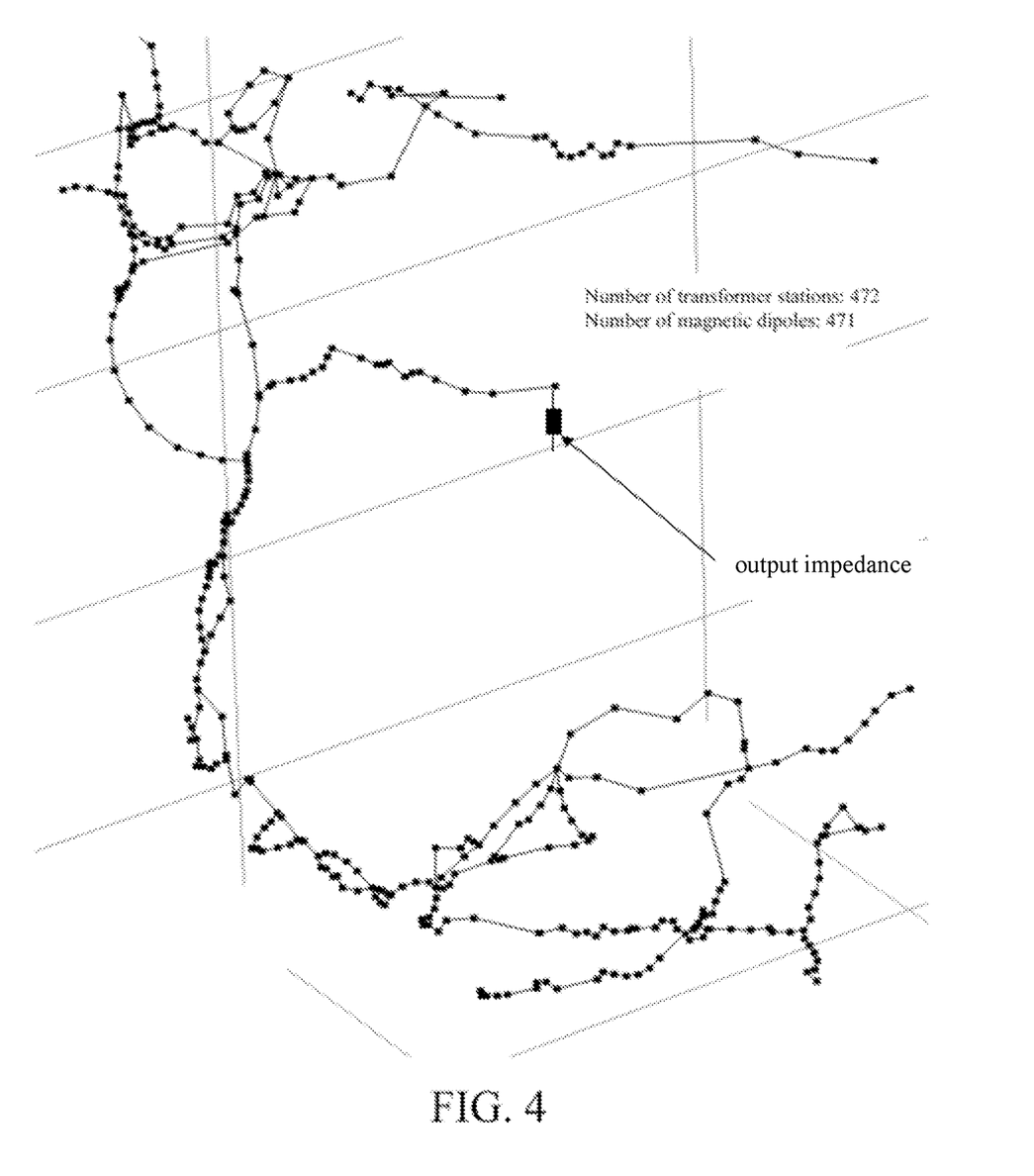
FIG. 4 is a distribution diagram of power grids with the voltage levels of 500 kV to 699 kV (Western United States)
Figure 5:
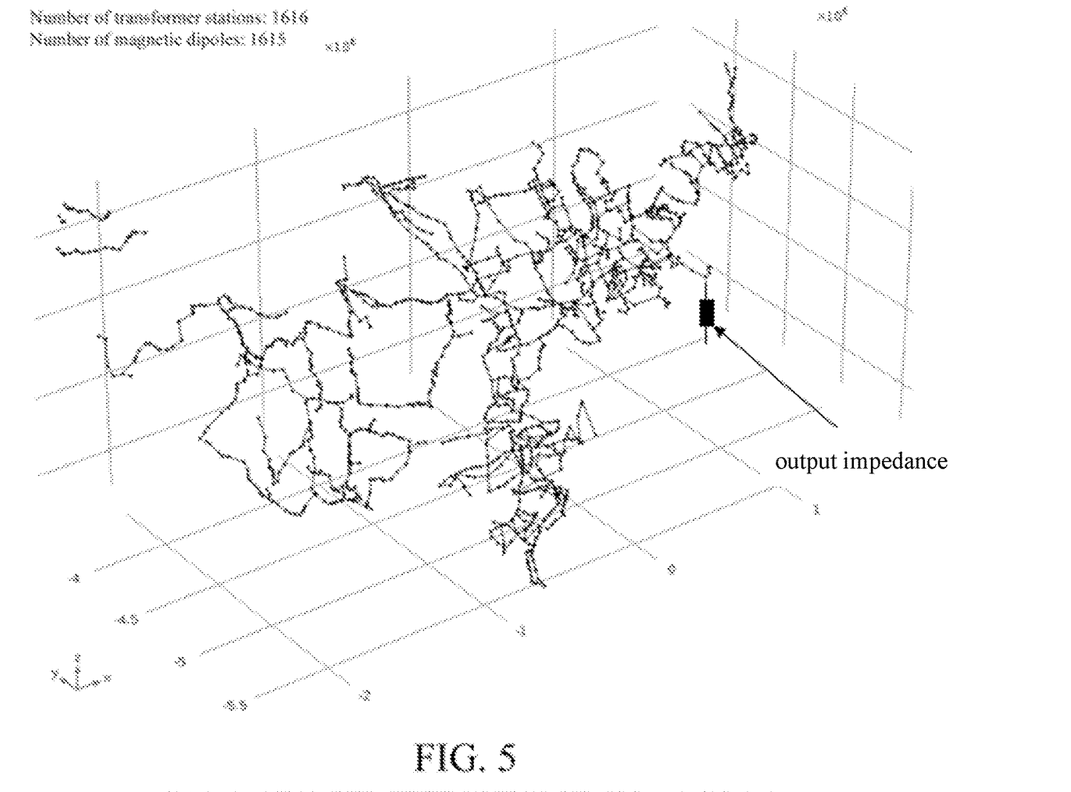
FIG. 5 is a distribution diagram of power grids with the voltage levels of 300 kV to 499 kV.

As shown in FIG. 1, the present invention provides an electromagnetic wave spatial analysis method based on multi-level magnetic dipole group modeling, including the following steps:

S1, obtaining a magnetic dipole group according to three-phase loops of power grids of various different voltage levels, and obtaining spatial coordinates of the magnetic dipole group according to the longitudes and latitudes as well as the altitudes of the power grids of various voltage levels, where the magnetic dipole group is coupled step by step;

S2, calculating the loop length of each three-phase magnetic dipole according to the spatial coordinates of the magnetic dipole group, and obtaining magnetic dipoles and antenna arrays implementing magnetic dipole functions according to the loop lengths, where specifically, long-distance power transmission loops of various voltage levels having the length L of $\lambda$, $\lambda/2$, $\lambda/4$, $\lambda/8$, $\lambda/10$ can be made equivalent to magnetic dipoles. For power transmission loops of various voltage levels having the loop lengths that do not satisfy the above conditions, if the sum of the lengths of multiple power transmission loops satisfies the above conditions, these power transmission loops of various voltage levels having the sum of the loop lengths that satisfies the conditions can be made equivalent to antenna arrays implementing magnetic dipole functions, where $\lambda$ represents the power frequency electromagnetic wave length;

S3, obtaining the current corresponding to the voltage on power transmission loops in the power grids of various voltage levels at different levels according to the installed capacities of the power grids of various voltage levels in different countries;

S4, building a multi-level dipole model according to the magnetic dipoles, the antenna arrays and the current; and S5, solving the multi-level dipole model to obtain spatial power frequency electromagnetic wave distribution.

Firstly, simulating calculation and vector superposition are carried out on the magnetic dipoles to calculate the spatial power frequency electromagnetic waves and electromagnetic wave distribution of the power grids of various voltage levels in the whole simulation domain; and then, vector superposition is carried out on the power frequency electromagnetic waves calculated by simulation of the power grids of various voltage levels, and the spatial power frequency electromagnetic waves and electromagnetic wave distribution characteristics of the power grids of various voltage levels in the whole simulation domain are analyzed.

Figure 10:
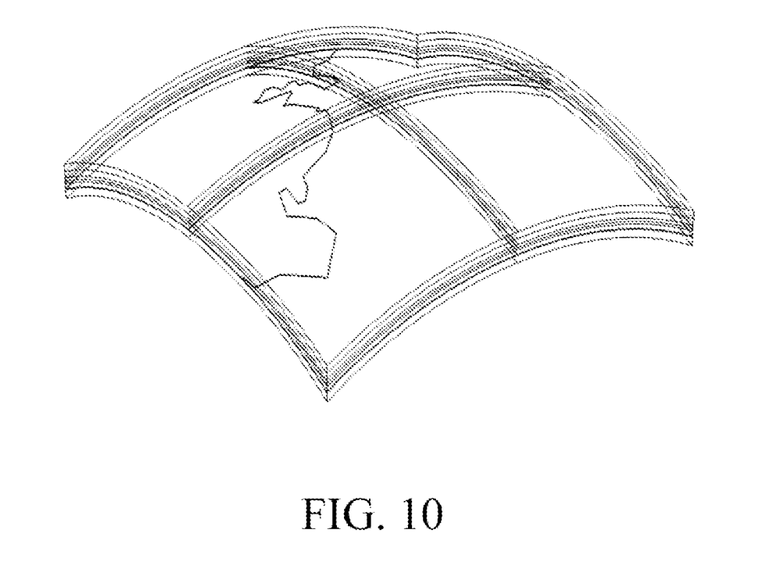
FIG. 10 is a schematic structural diagram of a curved surface model provided by the embodiment of the present invention.

In the embodiment of the present invention, in step S1, the three-phase loop of the power grid of each voltage level is made equivalent to the magnetic dipole group coupled step by step, and a spatial coordinate vector group of the magnetic dipole group is established according to the longitude and latitude as well as the altitude of the power grid of each voltage level, which is represented by set $V=(V_1, V_2, \ldots, V_i, \ldots V_n)$, where $V_i$ represents the magnetic dipole, and n represents the number of magnetic dipoles in the power grids of all voltage levels. Unlike the prior art, the present invention does not take Okinawa, Japan as the origin to calculate the coordinates of power grid nodes of different voltage levels, but directly performs statistics on the longitudes and latitudes of the power grid nodes. Then, a curved surface model is constructed according to the curvature of the earth (as shown in FIG. 10), the spatial coordinates of the magnetic dipoles are calculated according to the longitudes and latitudes, and the refraction caused by the propagation of the electromagnetic waves ignored in plane modeling to the far-field regions is considered, so that curved surface modeling can also ensure the accuracy of power grid modeling more accurately.

In the embodiment of the present invention, in step S2, for short-distance power transmission loops of different voltage levels, if the sum of the lengths of multiple power transmission loops is any one of $\lambda$, $\lambda/2$, $\lambda/4$, $\lambda/8$ or $\lambda/10$, these corresponding short-distance power transmission loops can be made equivalent to antenna arrays implementing magnetic dipole functions. The total length is the sum of the lengths of each power transmission loop, which is recorded as $$g(x, y, z) = \sum_{i=1}^{m} g_i(x, y, z),$$

where g is the length of the power transmission loop, and x, y, z are the spherical coordinates of the magnetic dipole. These coordinates take into account the altitude factor of the power transmission loops, so that the loop length is more accurate than plane modeling.

In the embodiment of the present invention, step S4 specifically includes the following steps:

S41, determining the size of the simulation domain, so that a required simulation region can be qualitatively and quantitatively selected, including:

an air model $M_a=(L_a, W_a, H_a, \rho_a)$; a land-ocean-seabed model $M_o=(L_o, W_o, H_o, \rho_o)$; an ionized layer model $M_i=(L_i, W_L, H_i, \rho_i)$, where $L_a$, $W_a$, $H_a$, and $\rho_a$ represent the length, width, height, and curvature of the air model respectively; $L_o$, $W_o$, $H_o$, and $\rho_o$ represent the length, width, height, and curvature of the land-ocean-seabed model respectively; and $L_i$, $W_i$, $H_i$, and $\rho_i$ represent the length, width, height, and curvature of the ionized layer model respectively;

S42, determining the physical material parameters of the simulation domain, including:

air parameter $\mu=1$, $\varepsilon=1$, $\sigma=0$ S/m;

ocean parameter $\mu=1$, $\varepsilon=81$, $\sigma=3$ S/m; and land parameter $\mu=1$, $\varepsilon=11.7$, $\sigma=0$ S/m, where according to the height of the ionized layer, the ionized layer can be divided into four layers: D, E, $F_1$, and $F_2$, namely D-layer parameter $\mu=1$, $\varepsilon=1$, $\sigma=10^{-8}$ S/m E-layer parameter $\mu=1$, $\varepsilon=1$, $\sigma=10^{-4}$ S/m $F_1$-layer parameter $\mu=1$, $\varepsilon=1$, $\sigma=10^{-6}$ S/m $F_2$-layer parameter $\mu=1$, $\varepsilon=1$, $\sigma=10^{-8}$ S/m where $\mu$ represents the relative permeability of the material, c represents the relative dielectric constant of the material, and a represents the conductivity of the material; and S43, building an ionized layer-air-land-coastline-ocean medium geometric model according to the size and the physical material parameters of the simulation domain.

In the embodiment of the present invention, step S5 specifically includes the following steps:

S51, carrying out grid partitioning on the simulation domain, and setting boundary conditions, where grid partitioning is to ensure the accuracy of the calculation of the whole simulation domain, and setting of the boundary conditions of each part of the simulation domain is to ensure the correctness of the simulating calculation at the connection of different parts of the simulation domain;

S52, determining the near-field region and far-field region of each antenna array of the magnetic dipole group with its coordinates as the center, where the desirable radius of the demarcation between the near-field region and the far-field region is $2L^2/\lambda$, where L is the length of the power transmission loop, and $\lambda$ is the power frequency electromagnetic wave length; and S53, enabling the changing electric field and magnetic field to excite each other according to the transmission theory of a long wave antenna to form electromagnetic waves propagating in a space, thereby simulating and calculating the near-field and far-field electromagnetic wave vector distribution of each antenna array, where step S53 specifically includes: based on Maxwell's equations, building power frequency electromagnetic waves and an electromagnetic wave calculation model of the power transmission network under boundary conditions, and calculating spatial power frequency electromagnetic waves and electromagnetic wave distribution of the power transmission network in the whole simulation domain through finite element simulation, which can be implemented in comsol.

Compared with the prior art, the multi-level magnetic dipole group modeling proposed by the present invention is characterized in that the power grid of each voltage level with the length of power transmission loop being one of $\lambda$, $\lambda/2$, $\lambda/4$, $\lambda/8$, and $\lambda/10$ is made equivalent to a magnetic dipole. For the power transmission loops that do not satisfy the length conditions, if the sum of the lengths of multiple power transmission loops satisfies the above length conditions, these power transmission loops can be made equivalent to antenna arrays implementing magnetic dipole functions, so that a multi-level magnetic dipole group is established, power frequency electromagnetic waves of a longer distance generated by the power grid of each voltage level can be simulated and analyzed, and the gap in the quantitative analysis of the power frequency electromagnetic waves generated by the power transmission loop of each voltage level propagating to the far-field region in the prior art is filled up. In addition, the method can also be applied to the relevant research and analysis of electromagnetic detection in the long-distance environment.

In order to further illustrate the electromagnetic wave spatial analysis method based on multi-level dipole group modeling provided by the embodiment of the present invention, the following detailed description is made in combination with specific examples and with reference to the attached drawings:

The installed capacity of power grids in the world is 7 000 000 000 kW. The power transmission/transformation/consumption networks distributed in different regions transmit a large amount of power, and the alternating electric field and alternating magnetic field excite each other. The propagation characteristics and spatial distribution of the power frequency electromagnetic waves generated by the power transmission network of each voltage level are analyzed, and then vector superposition is carried out on the power frequency electromagnetic waves generated by the power transmission network of each voltage level. The propagation characteristics and spatial distribution are analyzed and calculated through the multi-level dipole group model constructed by the power transmission network of each voltage level.

Figure 6:
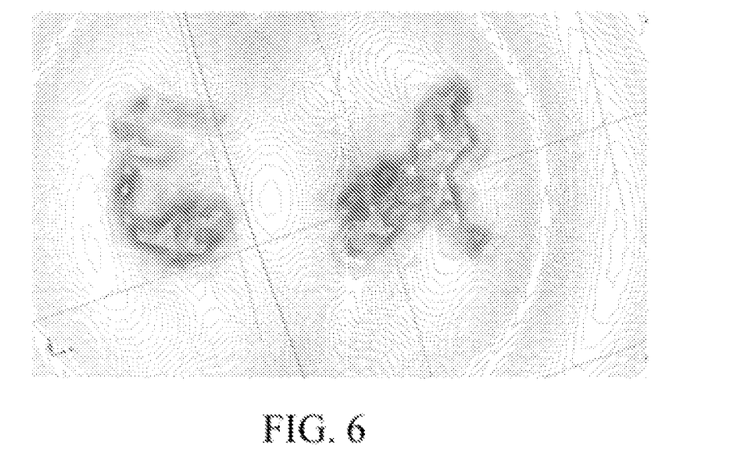
FIG. 6 is a contour map of the magnetic fields of power grids of 500 kV to 699 kV in the United States.
Figure 7:
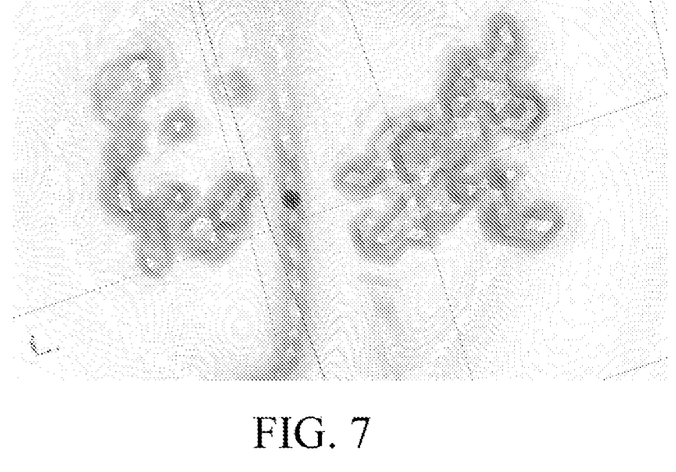
FIG. 7 is a contour map of the electric fields of power grids of 500 kV to 699 kV in the United States.

The present invention provides a power frequency electromagnetic wave (wave) analysis method for power grids of various voltage levels on the basis of making transmission lines of various voltage levels equivalent to magnetic dipoles, specifically including the following steps:

(1) performing statistics to obtain the longitudes and latitudes as well as the altitudes according to the real power grid distribution as well as the starting point and ending point of the power transmission loop of each voltage, determining the spatial coordinate vector of each magnetic dipole, and building a magnetic dipole group model for the power grid of each voltage level according to the spatial coordinate group, where in this example, power grid models of three levels in the United States are built, and FIG. 2, FIG. 3, FIG. 4, and FIG. 5 are the models constructed for the United States power grid in comsol;

(1.1) making the three-phase loop of the power grid of each voltage level equivalent to the magnetic dipole group coupled step by step, and establishing a spatial coordinate vector group of the magnetic dipole group according to the longitude and latitude as well as the altitude of the power grid distribution, which is represented by set V, where $V=(V_1, V_2, \ldots, V_i, \ldots, V_n)$, $V_i(x_i, y_i, z_i)$ represents the spatial coordinates of the magnetic dipole, and n represents the number of magnetic dipoles in the power grids of all voltage levels;

(1.2) calculating the length L of each power transmission loop according to the spatial coordinates of the starting point and the ending point of each power transmission loop, making the long-distance power transmission loops with lengths L satisfying $\lambda$, $\lambda/2$, $\lambda/4$, $\lambda/8$, and $\lambda/10$ equivalent to magnetic dipoles so as to form a magnetic dipole group, and making the multiple short-distance power transmission loops with the sum of lengths satisfying the length requirement equivalent to the antenna arrays implementing the magnetic dipole functions, where step (1.2) specifically includes:

(1.2.1) determining spatial coordinates of starting nodes $V_s(x_s, y_s, z_s)$ and terminating nodes $V_e(x_e, y_e, z_e)$ of the power transmission loops, and thereby calculating the lengths $g_i(x, y, z) = \sqrt{(x_s-x_e)^2+(y_s-y_e)^2+(z_s-z_e)^2}$ of the power transmission loops of the power grids;

(1.2.2) making the long-distance power transmission loops of various voltage levels with lengths L satisfying $\lambda$, $\lambda/2$, $\lambda/4$, $\lambda/8$, $\lambda/10$ ($\lambda$ represents the wavelength of the long-wave antenna) equivalent to the magnetic dipole group, and making the multiple short-distance power transmission loops with the sum of lengths satisfying the requirement described above equivalent to the antenna arrays implementing the magnetic dipole functions; and (1.2.3) for multiple short-distance power transmission loops that are made equivalent to the antenna arrays implementing the magnetic dipole functions, recording the total length being the sum of the lengths of each transmission loop as $$g(x, y, z) = \sum_{i=1}^{m} g_i(x, y, z),$$

where for example, on the voltage level of 345 kV to 499 kV in a U.S. power grid, there are two short-distance power transmission loops separated from the whole power grid, and the total length of the two is $\lambda/8$, then the superposition of the two can be made equivalent to a magnetic dipole, and the length of the power transmission loops is $\lambda/8$;

(1.3) calculating the three-phase voltage and current on the power transmission loop in the power grid of each voltage level according to the installed capacity of the power transmission network, where for example, the voltage level of the U.S. power grid can be roughly divided into 345 kV to 499 kV, 500 kV to 699 kV, and 700 kV to 799 kV, the total installed capacity of the U.S. power grid is about 258 MW, and the voltage and current of each branch in the power grid structure can be calculated according to the numerical relationship between power and average voltage; and (1.4) building an ionized layer-air-land-coastline-ocean medium geometric model, where step (1.4) specifically includes:

(1.4.1) qualitatively and quantitatively calculating the propagation characteristics and spatial distribution of the power frequency electromagnetic waves, determining the size of each part of the simulation domain, and setting its physical material parameters;

air model $M_a=(L_a, W_a, H_a, \rho_a)$;

land-ocean-seabed model $M_o=(L_o, W_o, H_o, \rho_o)$; and ionized layer model $M_i=(L_i, W_L, H_i, \rho_i)$, where $L_a, W_a, H_a$, and $\rho_a$ represent the length, width, height, and curvature of the air model respectively;

$L_o, W_o, H_o$, and $\rho_o$ represent the length, width, height, and curvature of the land-ocean-seabed model respectively; and $L_i, W_i, H_i$, and $\rho_i$ represent the length, width, height, and curvature of the ionized layer model respectively;

determining the physical material parameters of the simulation domain, including:

air parameter $\mu=1$, $\varepsilon=1$, $6=0S/m$;

ocean parameter $\mu=1$, $\varepsilon=81$, $\sigma=3$ S/m; and land parameter $\mu=1$, $\varepsilon=11.7$, $\sigma=0S/m$, where according to the height of the ionized layer, the ionized layer can be divided into four layers: D, E, $F_1$, and $F_2$, namely D-layer parameter $\mu=1$, $\varepsilon=1$, $\sigma=10^{-8}$ S/m E-layer parameter $\mu=1$, $\varepsilon=1$, $\sigma=10^{-4}$ S/m $F_1$-layer parameter $\mu=1$, $\varepsilon=1$, $\sigma=10^{-6}$ S/m $F_2$-layer parameter $\mu=1$, $\varepsilon=1$, $\sigma=10^{-8}$ S/m where µ represents the relative permeability of the material, ε represents the relative dielectric constant of the material, and a represents the conductivity of the material; and (1.4.2) building an ionized layer-air-land-coastline-ocean medium geometric model according to the determined size of the simulation domain and the physical material parameters, where in this example, the power grid model of three voltage levels of the U.S. power grid is built, and the voltage levels are 345 kV to 499 kV, 500 kV to 699 kV, and 700 kV to 799 kV respectively, and (2) carrying out simulating calculation and vector superposition on the power frequency electromagnetic waves generated by each dipole group, including:

(2.1) carrying out grid partitioning on the simulation domain, setting the boundary conditions, and carrying out simulating calculation, where for a large-scale simulation domain, it is necessary to carry out finite element grid partitioning analysis, reasonably set the grid size and grid partitioning mode, and ensure the accuracy of simulating calculation, and in this example, the grid partitioning mode is set as a "fine mode", a free tetrahedral grid is used, and COMSOL software will automatically set the size of the grid according to the size of the entire geometric model;

(2.2) determining the near-field region and far-field region of each magnetic dipole of the magnetic dipole group with its coordinates as the center and $2L^2/\lambda$ as the demarcation; and (2.3) according to the transmission theory of the long wave antenna, enabling alternating current and alternating magnetic field to excite each other, calculating the near-field and far-field electromagnetic wave vector distribution of each magnetic dipole by simulation under the constraints of boundary conditions and partitioning grid size, and carrying out vector superposition on the power frequency electromagnetic waves generated by each magnetic dipole to calculate the power frequency electromagnetic field (wave) distribution of the power transmission network of each voltage level in the whole simulation domain, and (3) carrying out vector superposition on the electromagnetic waves generated by all of the magnetic dipole groups to obtain the propagation properties and spatial distribution of the artificial electromagnetic waves, where FIG. 6 and FIG. 7 are the magnetic field/electric field contour map of the U.S. power grid of the voltage level of 500 kV to 699 kV, which can be generated in COMSO1.

Figure 8:
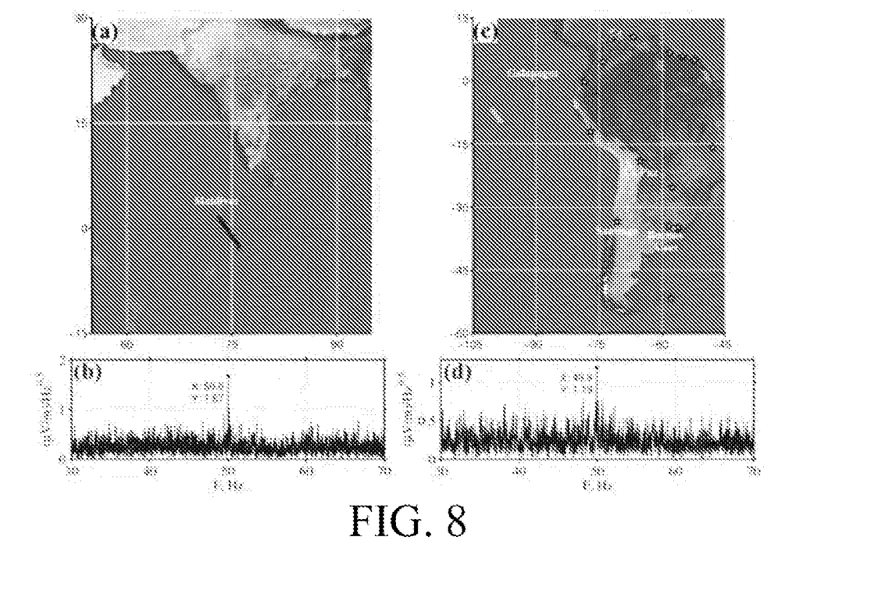
FIG. 8 is a satellite FFT spectrograph, where (a) is the satellite map of Maldives, (b) is the 50 Hz electric field data measured from the satellite altitude over Maldives, (c) is the satellite map of Galapagos, and (d) is the 50 Hz electric field data measured from the satellite altitude over Galapagos.
Figure 9:
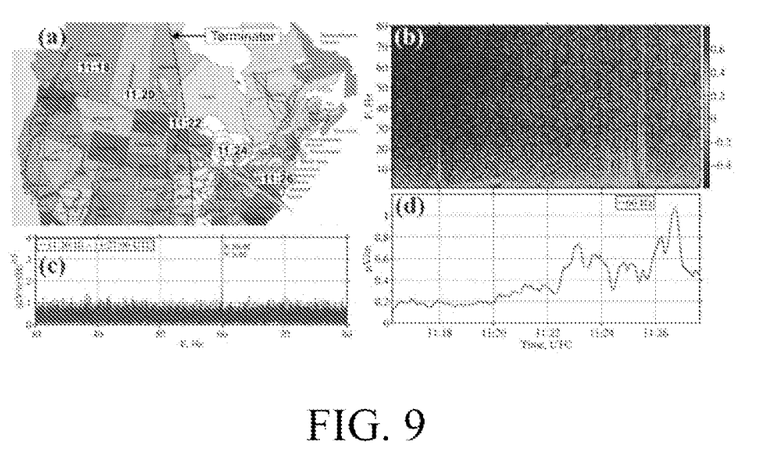
FIG. 9 is the 60 Hz electric field data obtained by the satellite, where (a) is the satellite map of the terminator of the United States, (b) is a dynamic Fourier spectrum, (c) is a signal fast Fourier transform (FFT) spectrum at individual time intervals, and (d) is the average absolute value of the 60 Hz signal.

The modeling and analysis methods of the present invention are verified below. The Chibis-M micro-satellite launched by Russia in 2012 is at an orbital altitude of 500 km, and the electromagnetic wave signal radiated by the power transmission line of the power grid was detected in the Indian Ocean (far-field region) 1300 km away from the southern Indian power grid and in the Pacific Ocean (far-field region) 4000 km to 4500 km away from the Chilean and Argentinean power grids, which confirmed the correctness of a model in which the power grid of each voltage level can be made equivalent to a 50 Hz ultra-long wave antenna array. As shown in FIG. 8, an obvious 50 Hz electromagnetic signal can be clearly seen in the FFT spectrogram. Likewise, on Apr. 19, 2014 11:16:14 to 11:27:38 (UTC), at an altitude of 417 km (over the United States), as shown in FIG. 9, an obvious 60 Hz electric field signal can be seen, which verifies the correctness of the model.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. An electromagnetic wave spatial analysis method based on multi-level dipole group modeling, comprising the following steps:

S1, obtaining a magnetic dipole group according to three-phase loops of power grids of various different voltage levels, and obtaining spatial coordinates of the magnetic dipole group according to the longitudes and latitudes as well as the altitudes of the power grids of various voltage levels;

S2, calculating the loop length of each three-phase magnetic dipole according to the spatial coordinates of the magnetic dipole group, and obtaining a multi-level magnetic dipole group including magnetic dipoles and antenna arrays implementing magnetic dipole functions according to the loop lengths;

S3, obtaining the current corresponding to the voltage on power transmission loops in the power grids of various voltage levels at different levels according to the installed capacities of the power grids of various voltage levels in different countries;

S4, building a multi-level dipole model according to the multi-level magnetic dipole group and the current; and S5, solving the multi-level dipole model to obtain spatial power frequency electromagnetic wave distribution.

2. The electromagnetic wave spatial analysis method according to claim 1, wherein in step S1, by directly performing statistics to obtain the longitudes and latitudes of grid nodes, a curved surface model is constructed according to the curvature of the earth, and the spatial coordinates of the magnetic dipoles are calculated according to the longitudes and latitudes.

3. The electromagnetic wave spatial analysis method according to claim 1, wherein in step S2, the loop length of each three-phase magnetic dipole is obtained by taking into account the altitude factor of the power transmission loops.

4. The electromagnetic wave spatial analysis method according to claim 3, wherein in step S2, the multi-level magnetic dipole group is established by making the power grid of each voltage level corresponding to any one of the loop lengths $\lambda$, $\lambda/2$, $\lambda/4$, $\lambda/8$, and $\lambda/10$ equivalent to a magnetic dipole, and making the multiple power transmission loops with the sum of lengths satisfying the length conditions described above equivalent to the antenna arrays implementing the magnetic dipole functions.

5. The electromagnetic wave spatial analysis method according to claim 1, wherein in step S4, the multi-level dipole model comprises: an ionized layer, a land-ocean-seabed layer, and an air layer.

6. The electromagnetic wave spatial analysis method according to claim 5, wherein a multi-level medium model is established taking into account the absorption and refraction of power frequency electromagnetic waves by the ionized layer and the factor that the power frequency electromagnetic waves reach a seawater layer through the land and the seabed; and a simulated multi-level dipole group model is built by carrying out modeling on a high-voltage power transmission network by the voltage levels respectively.

7. The electromagnetic wave spatial analysis method according to claim 1, wherein step S5 specifically comprises: calculating the electromagnetic wave transmission characteristic and the spatial distribution of each power transmission loop of which the voltage level is equivalent to a dipole or the power transmission loops capable of implementing the dipole functions, and carrying out vector superposition on power frequency electromagnetic waves generated by the power transmission loops with multiple voltage levels in a space.

* * * * *